United States Patent
Suh et al.

(10) Patent No.: US 11,301,319 B2
(45) Date of Patent: Apr. 12, 2022

(54) MEMORY DEVICE AND MEMORY SYSTEM HAVING MULTIPLE ERROR CORRECTION FUNCTIONS, AND OPERATING METHOD THEREOF

(71) Applicant: SAMSUNG ELECTRONICS CO., LTD., Suwon-si (KR)

(72) Inventors: Ki-seok Suh, Hwaseong-si (KR); Gwan-hyeob Koh, Seoul (KR); Yoon-jong Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 81 days.

(21) Appl. No.: 16/575,615

(22) Filed: Sep. 19, 2019

(65) Prior Publication Data

US 2020/0097361 A1 Mar. 26, 2020

(30) Foreign Application Priority Data

Sep. 21, 2018 (KR) .......................... 10-2018-0114183

(51) Int. Cl.
*G06F 11/10* (2006.01)
*G11C 7/06* (2006.01)
*G06F 13/16* (2006.01)
*G06F 13/40* (2006.01)

(52) U.S. Cl.
CPC ...... *G06F 11/1068* (2013.01); *G06F 13/1668* (2013.01); *G06F 13/4022* (2013.01); *G11C 7/06* (2013.01)

(58) Field of Classification Search
CPC ............ G06F 11/1068; G06F 11/1044; H03M 13/356
See application file for complete search history.

(56) References Cited

U.S. PATENT DOCUMENTS

| | | | |
|---|---|---|---|
| 6,216,247 B1 | 4/2001 | Creta et al. | |
| 6,279,072 B1 * | 8/2001 | Williams | G06F 11/1052 711/105 |
| 6,889,307 B1 | 5/2005 | Scheuerlein | |
| 7,810,017 B2 | 10/2010 | Radke | |
| 7,975,205 B2 * | 7/2011 | Thayer | G06F 11/1044 714/763 |
| 8,429,498 B1 | 4/2013 | Anholt et al. | |

(Continued)

FOREIGN PATENT DOCUMENTS

KR      10-1800444 B1    11/2017
KR   10-2018-0031572 A    3/2018

*Primary Examiner* — Steve N Nguyen
(74) *Attorney, Agent, or Firm* — Lee IP Law, PC

(57) ABSTRACT

A memory system includes a memory cell array including a first memory area and a second memory area, an input/output circuit including input/output lines for transmitting or receiving data bits and parity bits to or from the first and second memory areas, and an error correction circuit including a plurality of sub error correction circuits including a first sub error correction circuit for performing a first error correction operation on first data bits of the first memory area received through the input/output lines, and a second sub error correction circuit for performing a second error correction operation on second data bits of the second memory area received through the input/output lines. The first memory area has a higher bit error rate than the second memory area.

11 Claims, 16 Drawing Sheets

(56) References Cited

U.S. PATENT DOCUMENTS

| | | |
|---|---|---|
| 8,812,775 B2 | 8/2014 | Kim |
| 9,432,298 B1 | 8/2016 | Smith |
| 2009/0144598 A1* | 6/2009 | Yoon .................. G06F 11/1048 714/752 |
| 2010/0100797 A1 | 4/2010 | Chen |
| 2013/0080857 A1* | 3/2013 | Lee .................... G06F 11/1068 714/773 |
| 2013/0198587 A1* | 8/2013 | Kim .................... G06F 11/1048 714/763 |
| 2015/0074487 A1* | 3/2015 | Patapoutian ........ G06F 11/1012 714/758 |
| 2016/0132265 A1* | 5/2016 | Yi ......................... G06F 3/0614 711/105 |
| 2016/0132388 A1* | 5/2016 | Kim .................... G06F 11/1068 714/764 |
| 2016/0188405 A1* | 6/2016 | Li ....................... G11C 11/5628 714/755 |
| 2018/0062670 A1 | 3/2018 | Lu et al. |
| 2018/0081754 A1 | 3/2018 | Berman et al. |
| 2020/0081773 A1* | 3/2020 | Hanham ............. G06F 11/1048 |

\* cited by examiner

MEMORY DEVICE AND MEMORY SYSTEM HAVING MULTIPLE ERROR CORRECTION FUNCTIONS, AND OPERATING METHOD THEREOF

CROSS-REFERENCE TO RELATED APPLICATION

Korean Patent Application No. 10-2018-0114183, filed on Sep. 21, 2018, in the Korean Intellectual Property Office, and entitled: "Memory Device and Memory System Having Multiple Error Correction Functions, and Operating Method Thereof," is incorporated by reference herein in its entirety.

BACKGROUND

1. Field

Example embodiments relate to a memory device, and more particularly, to a memory device that is able to perform discrete error correction functions or multiple error correction function, and an operating method thereof.

2. Description of the Related Art

Demands for memory devices with high capacitance and low power consumption have become increased rapidly. To meet these demands, researches have been conducted on next-generation memory devices, which are non-volatile and do not require memory refresh. Such next-generation memory devices have been required to have characteristics, e.g., high integrity of dynamic random-access memory (DRAM), non-volatility of flash memory, high speed of static RAM (SRAM), etc. For example, the next-generation memory devices may include magnetic RAM (MRAM), phase-change RAM (PRAM), nano-floating gate memory (NFGM), polymer RAM (PoRAM), ferroelectric RAM (Fe-RAM), and resistive RAM (RRAM), which meet the above requirements.

Further, a process scale for manufacturing a memory device has been dramatically reduced to increase integrity and density of the memory device. As the process scale is reduced, a bit error rate of data in the memory device has been rapidly increased, and thus an error correction code (ECC) for addressing the high bit error rate has been required.

SUMMARY

Embodiments are directed to a memory system comprising: a memory cell array including a plurality of memory areas, the plurality of memory areas including a first memory area and a second memory area; an input/output circuit including input/output lines for transmitting or receiving data bits and parity bits to or from the plurality of memory areas; and an error correction circuit including a plurality of sub error correction circuits, the plurality of sub error correction circuits including a first sub error correction circuit for performing a first error correction operation on first data bits of the first memory area received through the input/output lines and a second sub error correction circuit for performing a second error correction operation on second data bits of the second memory area received through the input/output lines, wherein the first memory area has a higher bit error rate than the second memory area.

Embodiments are directed to an operating method of a memory system comprising a memory device, the method comprising: performing a first error correction operation on first data to be stored in a first memory area or to be read from the first memory area through input/output lines corresponding to the first memory area, by using a first sub error correction circuit; and performing a second error correction operation on second data to be stored in a second memory area or to be read from the second memory area through input/output lines corresponding to the second memory area, by using a second sub error correction circuit, wherein the first memory area includes a memory area having a temperature higher than an operating temperature of memory cells when a high-temperature process is performed on the memory device.

Embodiments are directed to a memory device comprising: a memory cell array including a plurality of memory areas, the plurality of memory areas including a first memory area and a second memory area; an input/output circuit including input/output lines for transmitting or receiving data bits and parity bits to or from the plurality of memory areas; an error correction circuit including a plurality of sub error correction circuits, the plurality of sub error correction circuits including a first sub error correction circuit for performing a first error correction operation on first data bits of the first memory area received through the input/output lines, and a second sub error correction circuit for performing a second error correction operation on second data bits of the second memory area received through the input/output lines; a switching circuit being connected to the input/output circuit and the error correction circuit; and a control logic to control the switching circuit to electrically connect the first memory area to the first sub error correction circuit and to control the switching circuit to selectively connect the second memory area to the second sub error correction circuit.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
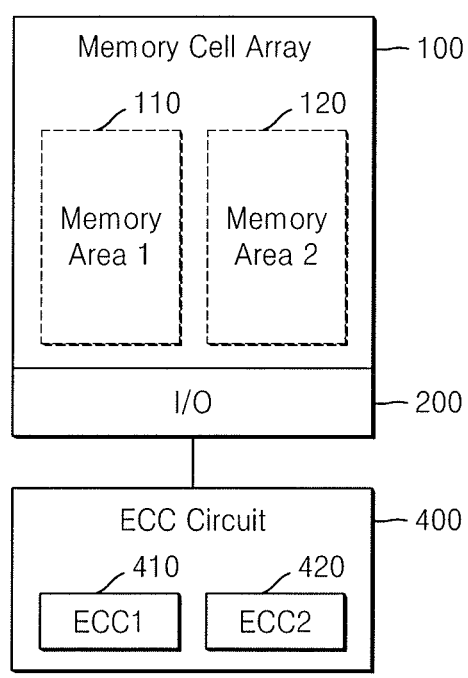
FIG. 1 illustrates a memory system according to an example embodiment.

FIG. 1 illustrates a memory system 1 according to an example embodiment. Referring to FIG. 1, the memory system 1 may include a memory cell array 100, an input/output circuit 200, and an error correction circuit 400. The memory cell array 100 may include a first memory area 110 and a second memory area 120. The error correction circuit 400 may include a first sub error correction circuit 410 and a second sub error correction circuit 420. For example, the number of memory areas and the number of sub error correction circuits may be changed.

According to an example embodiment, the first memory area 110 may correspond to a memory area having a bit error rate higher than the second memory area 120. Bit errors may occur in the first memory area 110 due to influence of a high-temperature process. For example, the bit errors in the first memory area 110 may be caused by the high-temperature process. In detail, when a packaging process for attaching a memory device to a printed circuit board (PCB) or the like is performed at a high-temperature, bit errors may occur in at least a partial area of the memory cell array 100 (e.g., the first memory area 110). To prevent or correct the bit errors in the first memory area 110, the memory system 1 may perform a first error correction operation on data to be written in the first memory area 110 or data to be read from the first memory area 110, using the first sub error correction circuit 410.

The second memory area 120 may correspond to a memory area having a bit error rate lower than the first memory area 110. The second memory area 120 may not be influenced by a high-temperature process, and thus bit errors may not often occur therein. For example, the second memory area 120 may be less influenced by the high-temperature process than the first memory area 110. For example, bit errors in the second memory area 120 may occur less than the first memory area 110. To prevent or correct the bit errors of the second memory area 120, the memory system 1 may perform a second error correction operation on data to be written in the second memory area 120 or data to be read from the second memory area 120, using the second sub error correction circuit 420.

The first error correction operation performed by the first sub error correction circuit 410 may detect and correct a larger number of bit errors than the second error correction operation performed by the second sub error correction circuit 420. For example, the first error correction operation may correct a 3-bit error and detect a 4-bit error when the second error correction operation corrects a 2-bit error and detect a 3-bit error.

In the memory system 1, the first sub error correction circuit 410 may perform the first error correction operation on data to be written in or to be read from the first memory area 110. The second sub error correction circuit 420 may perform the second error correction operation on data to be written in or to be read from the second memory area 120. For example, bit errors in the first memory area 110 influenced by a high-temperature process may be detected or corrected through performing the first error correction operation rather than the second error correction operation in view of performance or efficiency. As the first error correction operation, which requires a high ratio of parity bits to data bits, is performed on only the first memory area 110 greatly influenced by a high-temperature process, memory overhead may be reduced, and the efficiency of the memory system 1 may be increased. For example, when a ratio of parity bits to data bits is increased, the efficiency of the memory system 1' may be decreased, because the increased parity bits requires additional memory capacity.

Figure 2:
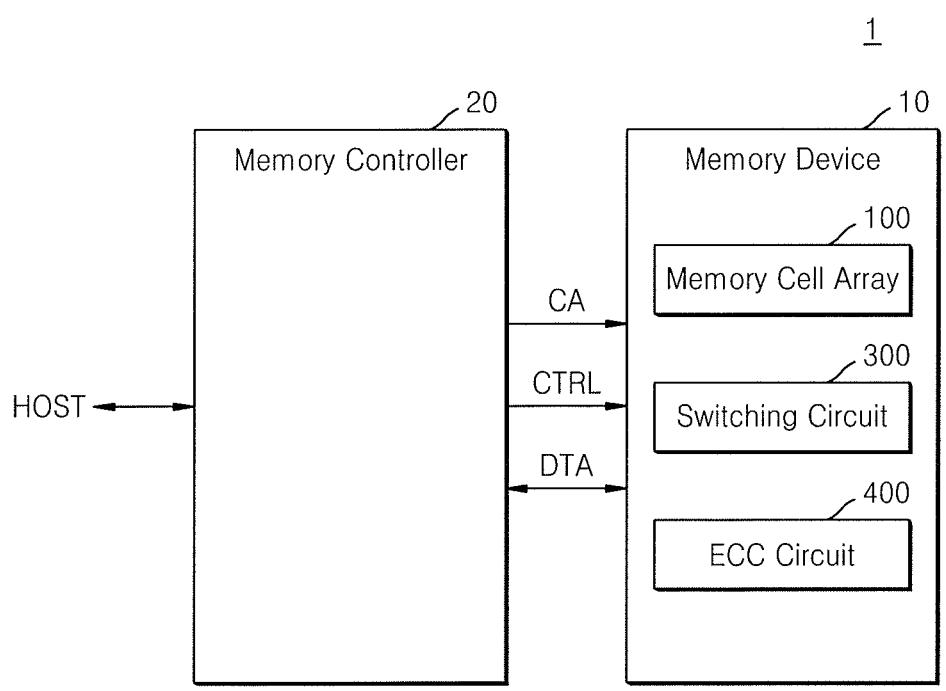
FIG. 2 illustrates a memory system according to an example embodiment.

FIG. 2 illustrates the memory system 1 according to an example embodiment. Referring to FIG. 2, the memory system 1 may include a memory device 10 and a memory controller 20. The memory device 10 may include the memory cell array 100, a switching circuit 300, and the error correction circuit 400.

The memory controller 20 may control the memory device 10 to read data from the memory device 10 in response to a read request received from a host HOST and to write data to the memory device 10 in response to a write request received from the host HOST. For example, the memory controller 20 may control write, read, and erase operations of the memory device 10 according to a command/address signal CA and a control signal CTRL to the memory device 10. Data DTA to be written or data DTA to be read may be transmitted between the memory controller 20 and the memory device 10. The data DTA may include read data transmitted from the memory device 10 to the memory controller 20 and write data transmitted from the memory controller 20 to the memory device 10.

The memory cell array 100 may include a plurality of memory cells. The plurality of memory cells may be arranged in a matrix structure with rows and columns. The memory cell array 100 may include a plurality of word lines and a plurality of bit lines connected to the plurality of memory cells. The plurality of word lines may extend in a row direction of the plurality of memory cells and be connected to corresponding memory cells. The plurality of bit lines may extend in a column direction of the plurality of memory cells and be connected to corresponding memory cells. The plurality of memory cells of the memory cell array 100 may include, e.g., dynamic random-access memory (DRAM) cells, static RAM (SRAM) cells, flash memory cells, phase-change RAM (PRAM) cells, resistive RAM (ReRAM) cells, magnetic RAM (MRAM) cells, or another type of memory cells. DRAM cells may include synchronous DRAM (SDRAM) cells, or the like.

The memory device 10 may include typical/general circuits associated with the memory cell array 100, e.g., a row decoder, a column decoder, sense amplifiers, or the like. The row decoder may select one of the plurality of word lines connected to the memory cell array 100. The row decoder may decode a row address included in the command/address signal CA, select a word line corresponding to the row address, and activate the selected word line.

The memory device 10 according to an example embodiment may split the memory cell array 100 into a plurality of areas and perform different error correction functions on data bits in the plurality of areas, using a plurality of error correction circuits in the error correction circuit 400. For example, the memory controller 20 may control the memory device 10 to connect a partial area of the memory cell array 100 to a first sub error correction circuit for performing a first error correction function, and to connect other partial area of the memory cell array 100 to a second sub error correction circuit for performing a second error correction function, based on a switching operation of the switching circuit 300.

According to an example embodiment, when the memory device 10 is produced or manufactured, bit errors may occur in the plurality of areas of the memory cell array 100 due to processes preformed at different temperatures. For example, when the memory cells of the memory device 10 are MRAM cells, a temperature of the memory cells should be maintained below an operating temperature of the memory cells to prevent errors of data bits in the memory cells. For example, the operating temperature of the memory cells may be about −40° C. to about 150° C. However, when a high-temperature process is performed on the memory cells to produce the memory device 10, the temperature of a partial area of the memory cells may exceed over the operating temperature. For example, when a reflow soldering process is performed on the memory cells, the temperature of the memory cells may exceed over the operating temperature. In the following description, a first area of the memory cell array 100 may correspond to a first memory area when the temperature of the area of the memory cell array exceeds over the operating temperature due to the high-temperature process. A second area of the memory cell array 100 may correspond to a second memory area when the temperature of the area of the memory cell is maintained below or at the operating temperature in the high-temperature process.

For example, to reduce data bit errors of data bits of both the first memory area and the second memory area of the memory cell array 100, parity bits for the data bits of the first and second memory areas may be increased. As the parity bits are increased, less data bits may be stored in the same memory capacitance. To increase data bits stored at the same memory capacitance, the memory controller 20 may control the memory device 10 to perform a first error correction function on a partial area of the memory cell array 100 and to perform a second error correction function on another partial area of the memory cell array 100, based on the command/address signal CA and the control signal CTRL. For example, parity bits for the first error correction function may be more than parity bits for the second error correction function.

According to an example embodiment, the memory device 10 may include a non-volatile memory device. The non-volatile memory device may include, e.g., read only memory (ROM), programmable ROM (PROM), electrically programmable ROM (EPROM), electrically erasable and programmable ROM (EEPROM), flash memory, PRAM, MRAM, RRAM, ferroelectric RAM (FRAM), or the like.

According to an example embodiment, the memory device 10 may include. e.g., a volatile memory device. The volatile memory may include, e.g., DRAM, synchronous DRAM (SDRAM), double data rate (DDR) SDRAM, low power double data rate (LPDDR) SDRAM, graphics double data rate (GDDR) SDRAM, rambus DRAM (RDRAM), SRAM, or the like.

According to an example embodiment, the memory system 1 may include, e.g., at least one of a hard disk drive (HDD), a solid state drive (SSD), a compact flash (CF) card, a secure digital (SD) card, a micro secure digital (micro-SD) card, a mini secure digital (mini-SD) card, an extreme digital (xD) card, and a memory stick.

Figure 3:
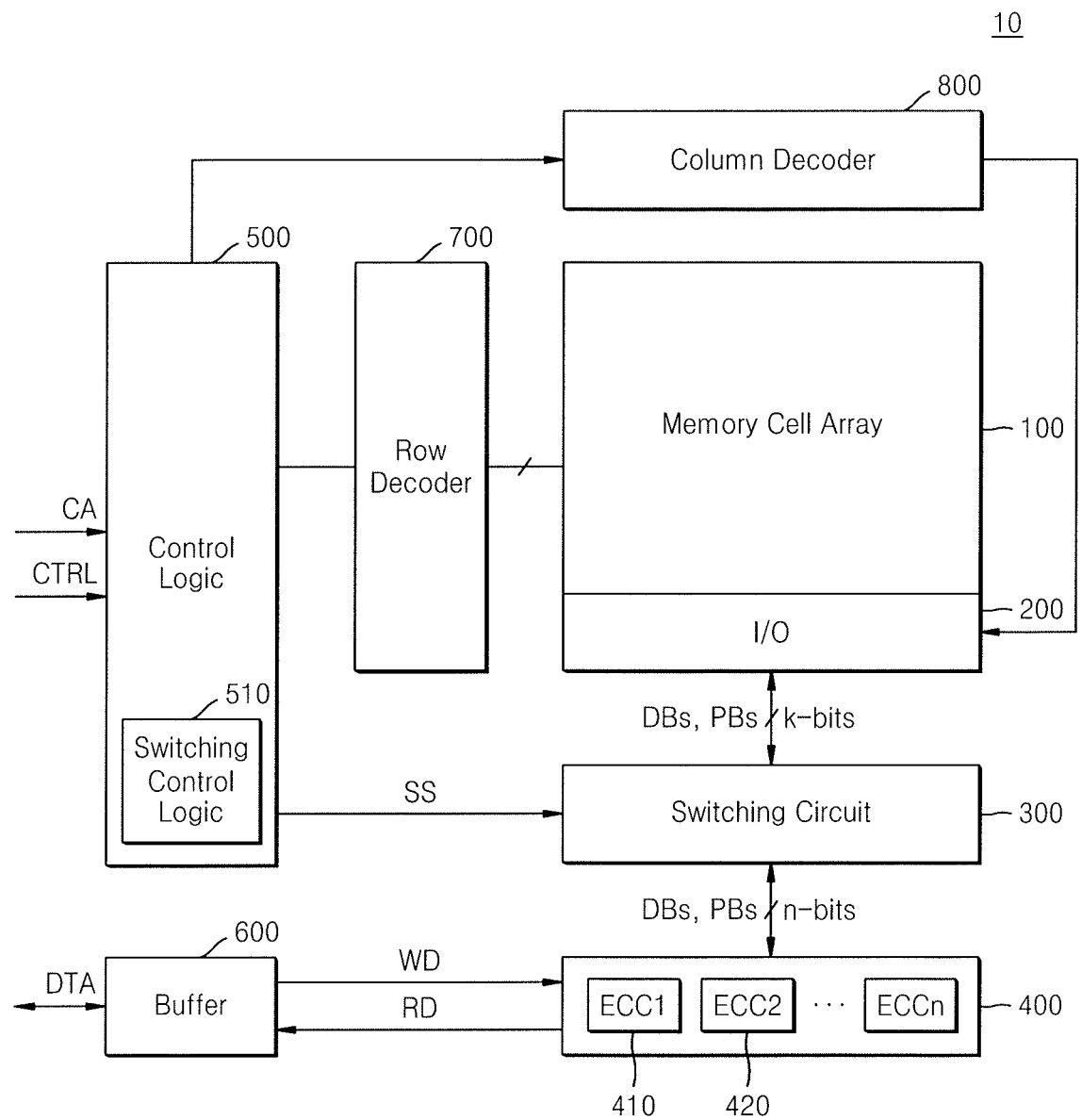
FIG. 3 illustrates a memory device according to an example embodiment.

FIG. 3 illustrates the memory device 10 according to an example embodiment. Referring to FIGS. 2 and 3, the memory device 10 may include the memory cell array 100, the switching circuit 300, and the error correction circuit 400, and may further include the input/output circuit 200 and a control logic 500. The control logic 500 may include, e.g., a switching control logic 510. According to another example embodiment, the switching control logic 510 may be provided outside the control logic 500.

The memory cell array 100 may include a plurality of memory cells connected to word lines and bit lines. The memory cell array 100 may be connected to a row decoder 700 through global word lines and be connected to the input/output circuit 200 through global bit lines. The global word lines may be connected to a plurality of word lines in the memory cell array 100. The global bit lines may be connected to a plurality of bit lines in the memory cell array 100. Each of the memory cells may store one or more bits of data. For example, each memory cell may include, e.g., a multi-level cell (MLC), a triple-level cell (TLC), and a quad-level cell (QLC).

The control logic 500 may output various internal control signals for writing data in the memory cell array 100 or for reading data from the memory cell array 100, based on a command/address signal CA and a control signal CTRL received from the memory controller 20. For example, the memory device 10 may include a voltage generator. The control logic 500 may control the voltage generator to generate a write voltage, a read voltage, and an erase voltage. The control logic 500 may select one of the plurality of word lines by controlling the row decoder 700, select one of the plurality of the bit lines by controlling a column decoder 800, and activate a sense amplifier corresponding to the selected bit line among a plurality of sense amplifiers in the input/output circuit 200, based on the command/address signal CA and the control signal CTRL.

The input/output circuit 200 may be connected to the error correction circuit 400 through the switching circuit 300. The control logic 500 may selectively control connection between the input/output circuit 200 and the error correction circuit 400 by controlling the switching circuit 300. According to an example embodiment, the switching circuit 300 may be connected to the input/output circuit 200 through k input/output lines for transmitting data bits or parity bits to the input/output circuit 200 and for receiving the data bits or the parity bits from the input/output circuit 200, and be connected to the error correction circuit 400 through n input/output lines for transmitting data bits or parity bits to the error correction circuit 400 and for receiving the data bits or the parity bits from the error correction circuit 400. Herein, k may equal the number of sense amplifiers and the number of input/output lines included in the input/output circuit 200, and n may equal the number of sub error correction circuits included in the error correction circuit 400.

According to an example embodiment, the switching control logic 510 may generate a switching signal SS based on the command/address signal CA and the control signal CTRL. The switching signal SS may control the switching circuit 300 to selectively control the connection between the input/output circuit 200 and the error correction circuit 400. According to the selected connection between the input/output circuit 200 and the error correction circuit 400, one of the plurality of sub error correction circuit ECC1 to ECCn in the error correction circuit 400 may perform an error correction operation on data to be written in some memory cells in the memory cell array 100 or data to be read from the some memory cells in the memory cell array 100.

The error correction circuit 400 may include the plurality of sub error correction circuits ECC1 to ECCn for performing error correction operations. According to an example embodiment, the sub error correction circuits ECC1 to ECCn may correct different numbers of bit errors or detect the different numbers of the bit errors. To correct or detect the different numbers of the bit errors, the sub error correction circuits ECC1 to ECCn may generate different numbers of parity bits. For example, to correct or detect a larger number of bit errors, a ratio of the number of parity bits generated by a sub error correction circuit to the number of data bits corrected or detected by the sub error correction circuit may be increased. For example, to correct or detect a larger number of bit errors, a larger number of parity bits may be required to address the larger number of bits errors.

According to an example embodiment, one of the sub error correction circuits ECC1 to ECCn (e.g., the first sub error correction circuit ECC1/410) may generate parity bits PBs for write data WD received from the memory controller 20 through a buffer 600. According to a switching operation of the switching circuit 300, the error correction circuit 400 may transmit the write data WD and the generated parity bits PBs to some of the plurality of memory cells in the memory cell array 100 (e.g., a first memory area). According to an example embodiment, one of the sub error correction circuits ECC1 to ECCn (e.g., the first sub error correction circuit ECC1/410) may receive data bits DBs and parity bits PBs from some of the plurality of memory cells in the memory cell array 100 (e.g., the first memory area) and perform an error correction operation with reference to the data bits DBs and the parity bits PBs. After performing the error correction operation, the error correction circuit 400 may transmit the read data RD to the memory controller 20 through the buffer 600.

Figure 4:
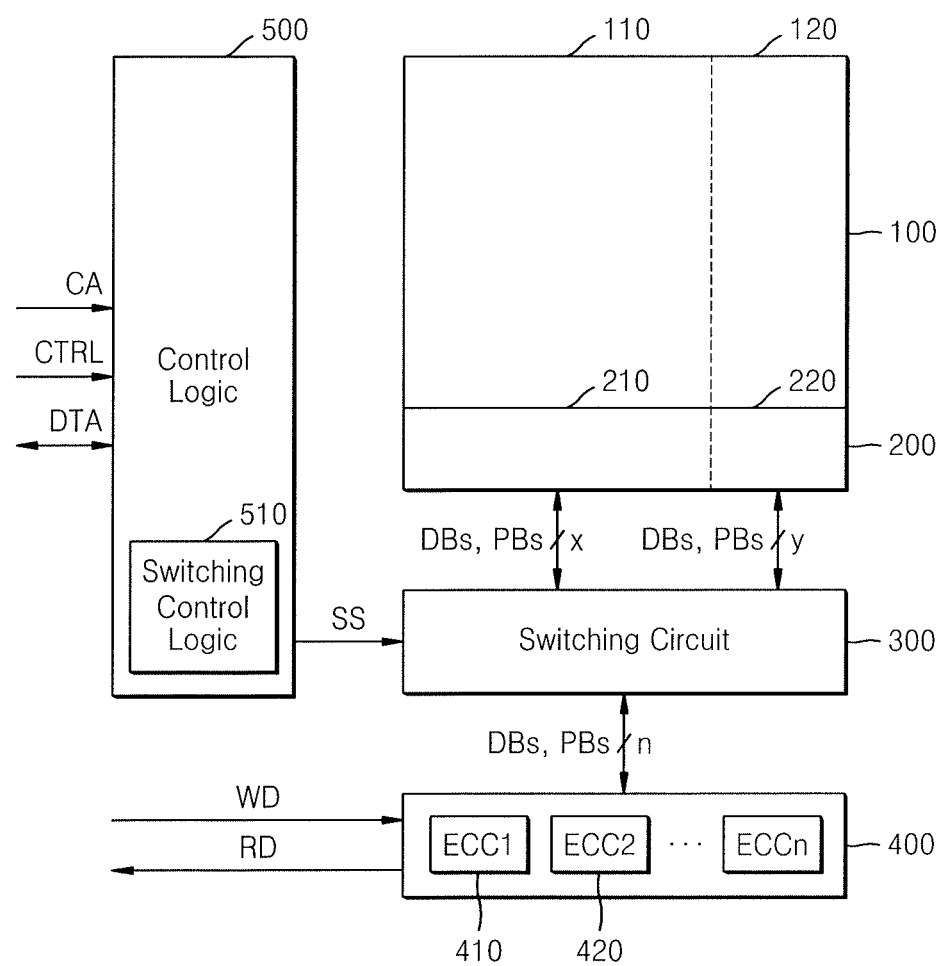
FIG. 4 illustrates a memory device according to an example embodiment.

FIG. 4 illustrates the memory device 10 according to an example embodiment. Referring to FIG. 4, the memory cell array 100 may include the first memory area 110 and the second memory area 120. The input/output circuit 200 may include a first sub input/output circuit 210 and a second sub input/output circuit 220. The first sub input/output circuit 210 may be connected to the switching circuit 300 through x input/output lines, transmit x bits data to the switching circuit 300, and receive the x bits data from the switching circuit 300. The second sub input/output circuit 220 may be connected to the switching circuit 300 through y input/output lines, transmit y bits data to the switching circuit 300, and receive the y bits data from the switching circuit 300. For example, the k input/output lines for connecting the input/output circuit 200 and the switching circuit 300 in FIG. 3 may be a sum of the x input/output lines and the y input/output lines in FIG. 4 (i.e., k=x+y).

According to an example embodiment, during a read operation, data of memory cells in the first memory area 110 may be amplified by x sense amplifiers in the first sub input/output circuit 210, and input to the switching circuit 300 through and the x input/output lines. For example, during the read operation, data of memory cells included in the second memory area 120 may be amplified by y sense amplifiers in the second sub input/output circuit 220, and input to the switching circuit 300 through the y input/output lines. In other words, the x and y sense amplifiers may amplify the data output from the memory cells in the first and second memory areas 110 and 120, respectively, and provide the amplified data to the switching circuit 300 through the x and y input/output lines, respectively.

According to an example embodiment, during a write operation, data from the switching circuit 300 may be written in the memory cells in the first memory area 110 through the first sub input/output circuit 210. For example, data from the switching circuit 300 may be written in the memory cells in the second memory area 120 through the second sub input/output circuit 220.

The sub error correction circuits ECC1 to ECCn may require different numbers of input/output lines to perform different error correction operations. For example, the first sub error correction circuit ECC1/410 may require x input/output lines, and the second sub error correction circuit ECC2/420 may require y input/output lines, because the error correction operations of the first and second error correction circuits may be performed based on data bits DBs or parity bits PBs received from or to be transmitted to different input/output lines.

According to an example embodiment, the number of the x input/output lines may be greater than the number of the y input/output lines. For example, first data, which are written in the memory cells in the first memory area 110 or are read from the memory cells in the first memory area 110, may include first data bits and first parity bits. Errors of the first data bits may be detected or corrected based on the first parity bits. For example, second data, which are written in the memory cells in the second memory area 120 or are read from the memory cells in the second memory area 120, may include second data bits and second parity bits. Errors of the second data bits may be detected or corrected based on the second parity bits. For example, the first parity bits of the first data may have a different bit number from the second parity bits of the second data. For example, the first parity bits of the first data may have greater bit number than the second parity bits of the second data. For example, the first parity bits of the first data may have 3 bits, and the second parity bits of the second data may have 2 bits.

For example, the first sub error correction circuit 410 may require 50 input/output lines to perform a first error correction operation. The first sub error correction circuit 410 may transmit or receive data bits DBs through 32 input/output lines among the 50 input/output lines. The 32 input/output lines may transmit or receive a data bit DB. Further, the first sub error correction circuit 410 may transmit or receive parity bits PBs through 18 input/output lines among the 50 input/output lines. The 18 input/output lines may transmit or receive the parity bit PBs. As the first sub error correction circuit 410 may include the 32 input/output lines for transmitting or receiving the data bits DBs and the 18 input/output lines for transmitting or receiving the parity bits PBs, to perform the first error correction operation, a ratio of input/output lines for transmitting or receiving parity bits PBs to input/output lines for transmitting or receiving data bits DBs in the first error correction operation may be 18/32.

For example, the second sub error correction circuit 420 may require 78 input/output lines to perform a second error correction operation. The second sub error correction circuit 420 may transmit or receive data bits DBs through 64 input/output lines among the 78 input/output lines and transmit or receive parity bits PBs through 14 input/output lines among the 78 input/output lines. A ratio of input/output lines for transmitting or receiving parity bits PBs to input/output lines for transmitting or receiving data bits DBs in the second error correction operation may be 14/64. In comparison between the first and second error correction operations, the first error correction operation may require a higher ratio of input/output lines for transmitting or receiving parity bits PBs to input/output lines for transmitting or receiving data bits DBs than the second error correction operation, to detect and correct a larger number of bit errors.

Figure 5A:
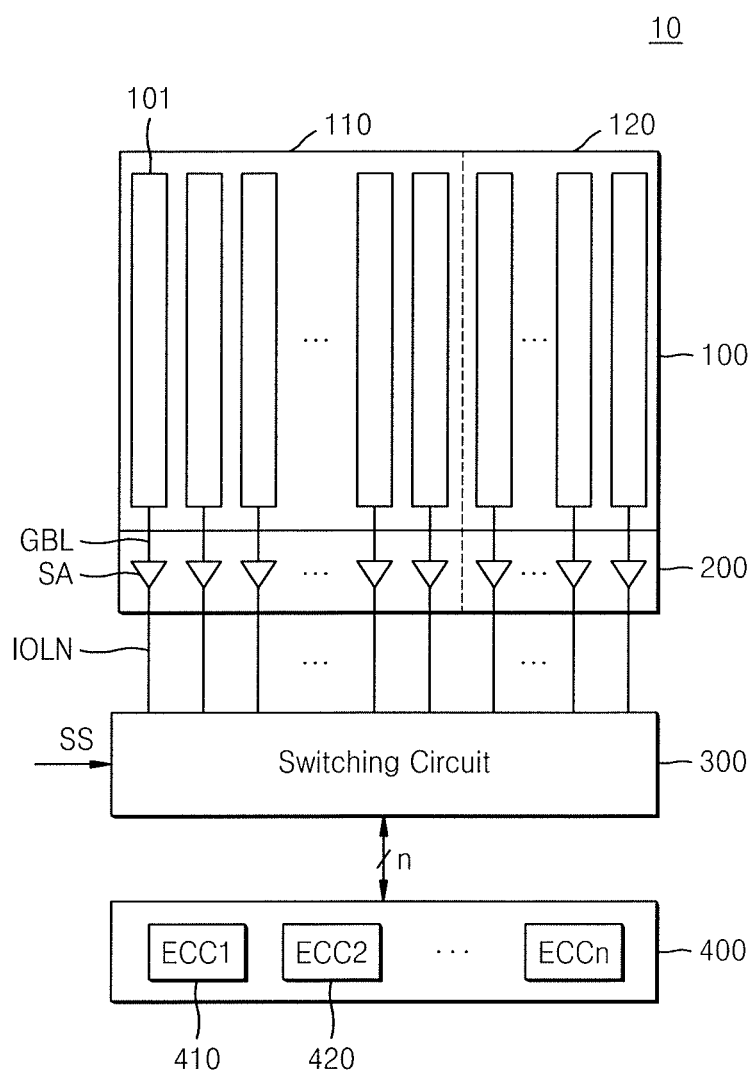
FIG. 5A illustrates a memory device according to an example embodiment.
Figure 5B:
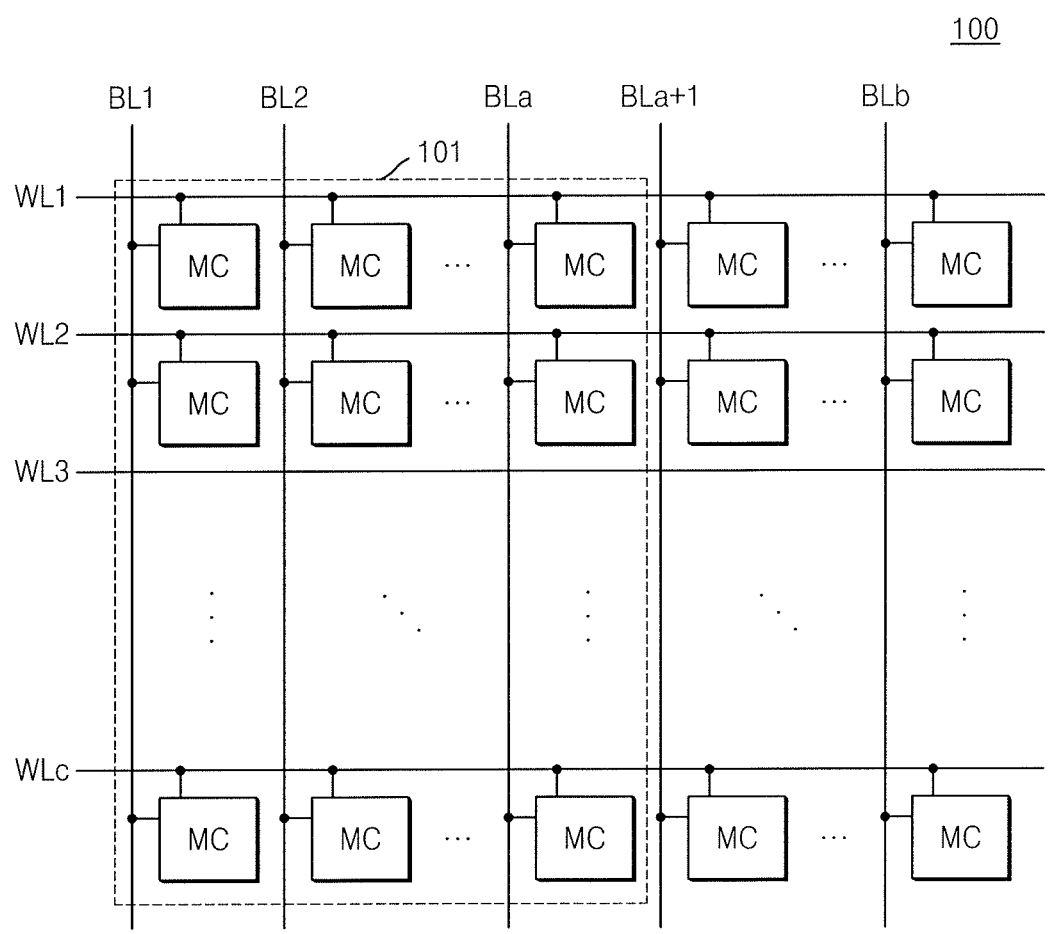
FIG. 5B illustrates a sub memory area according to an example embodiment.

FIG. 5A illustrates the memory device 10 according to an example embodiment. FIG. 5B illustrates a sub memory area 101 according to an example embodiment.

Referring to FIG. 5A, the memory cell array 100 may include the first memory area 110 and the second memory area 120, and may include a plurality of sub memory areas 101. The plurality of sub memory areas 101 may include memory cells of the memory cell array 100. For example, the memory cells of the memory cell array 100 may be arranged in a matrix structure having rows and columns. Each sub memory area 101 may include memory cells in at least one column or at least one row.

Referring to FIG. 5B, a memory cell array 100 may include memory cells MC connected to 'b' bit lines BL including a first bit line BL1 to a $b^{th}$ bit line BLb, and 'c' word lines WL including a first word line WL1 to a $c^{th}$ word line WLc. In other words, the number of the 'b' bit lines BL may be 'b', and the number of the 'c' bit lines WL may be 'c'. Herein, 'b' and 'c' may be natural numbers greater than zero. The memory cells MC may be arranged based on points where the bit lines BL and the word lines WL cross each other. In other words, the memory cells MC may be adjacent to the points where the bit lines BL and the word lines WL intersect.

Referring to FIG. 5B, the sub memory area 101 may include memory cells MC connected to a plurality of bit lines BL. Each sub memory area 101 may include a plurality of memory cells MC connected to 'a' bit lines BL corresponding to a part of the 'b' bit lines BL. The number of the 'a' bit lines BL may be 'a'. Herein, 'a' is a natural number greater than 0. For instance, the sub memory area 101 may include memory cells MC connected to 64 bit lines BL. The number of the 64 bit lines BL may be 64. The 64 bit lines BL may be adjacent to each other. For example, when a read voltage is applied to the first word line WL1, data stored in the memory cells MC connected to the 64 bit lines BL may be output through the 64 bit lines BL to the input/output circuit 200. The output data from the memory cells MC may be amplified in the input/output circuit 200.

According to an example embodiment, bit errors may occur in the memory cells MC of some sub memory areas 101 due to a high-temperature process. For example, the output data from the memory cells MC may have the bit errors caused by the high-temperature process. The high-temperature process may be a soldering process or any process performed at a high temperature. The error correction circuit 400 may perform an error correction operation to detect and correct the bit errors of the output data from memory cells MC. As there is a high probability that bit errors occur in some sub memory areas 101 influenced by a high-temperature process, the error correction circuit 400 may perform an error correction operation for detecting and correcting a larger number of bit errors.

Referring again to FIG. 5A, the sub memory areas 101 may be connected to the switching circuit 300 through the input/output circuit 200. The input/output circuit 200 may include a plurality of sense amplifiers SA, and each sense amplifier SA may amplify data received from each sub memory area 101 through a global bit line GBL and transmit the amplified data to the switching circuit 300 through a corresponding input/output line IOLN. For example, each sense amplifier SA may receive data from the switching circuit 300 through the corresponding input/output line IOLN and transmit the data to each sub memory area 101 through the global bit line GBL.

For example, when a write operation is performed on write data received from the memory controller 20, the error correction circuit 400 may generate parity bits for the write data. The write data and the parity bits may be stored in the memory cell array 100. For example, when a read operation is performed on read data stored in the memory cell array 100, the error correction circuit 400 may perform an error correction operation for detecting and correcting errors with reference to the read data including data bits DBs and parity bits PBs output from the memory cell array 100. During the error correction operation, each sub memory area 101 may receive or output a data bit DB and/or a parity bit PB.

For example, the first memory area 110 may be influenced by a high-temperature process and thus have a high probability that bit errors occur. The high-temperature process may be a soldering process or any process performed at a high temperature. For example, the high temperature may be higher than an operating temperature of memory cells. For example, when the first memory area 110 is exposed to or influenced by the high-temperature process, the first sub error correction circuit ECC1/410 may write data bits DBs and parity bits PBs for correcting or detecting error of the data bits DBs in the sub memory areas 101 of the first memory area 110. For example, the data bits DBs may be written in some sub memory areas 101 of the first memory area 110, and the parity bits PBs may be written in other sub memory areas 101 of the first memory area 110.

Figure 6A:
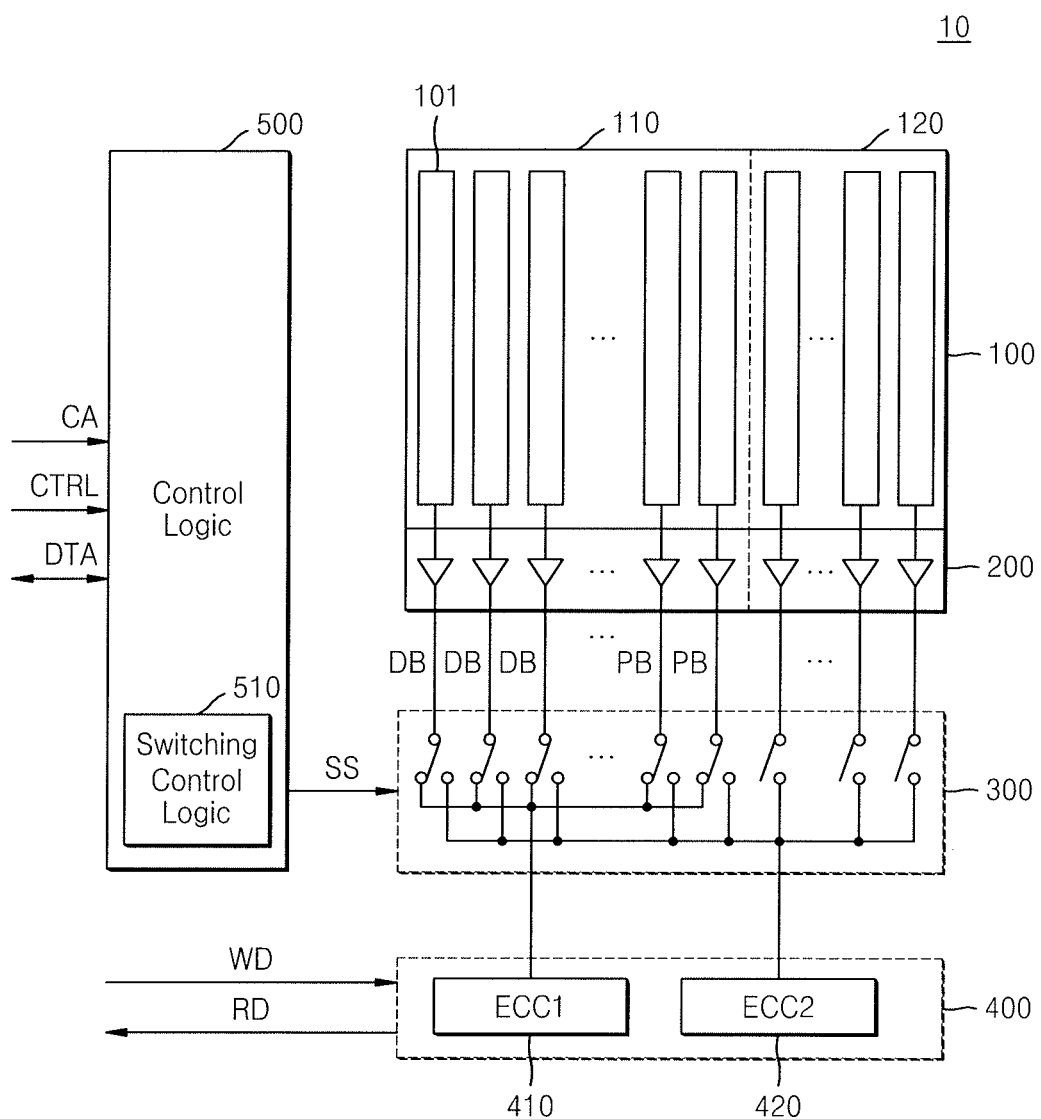
FIG. 6A illustrates a first error correction operation of a memory device according to an example embodiment.
Figure 6B:
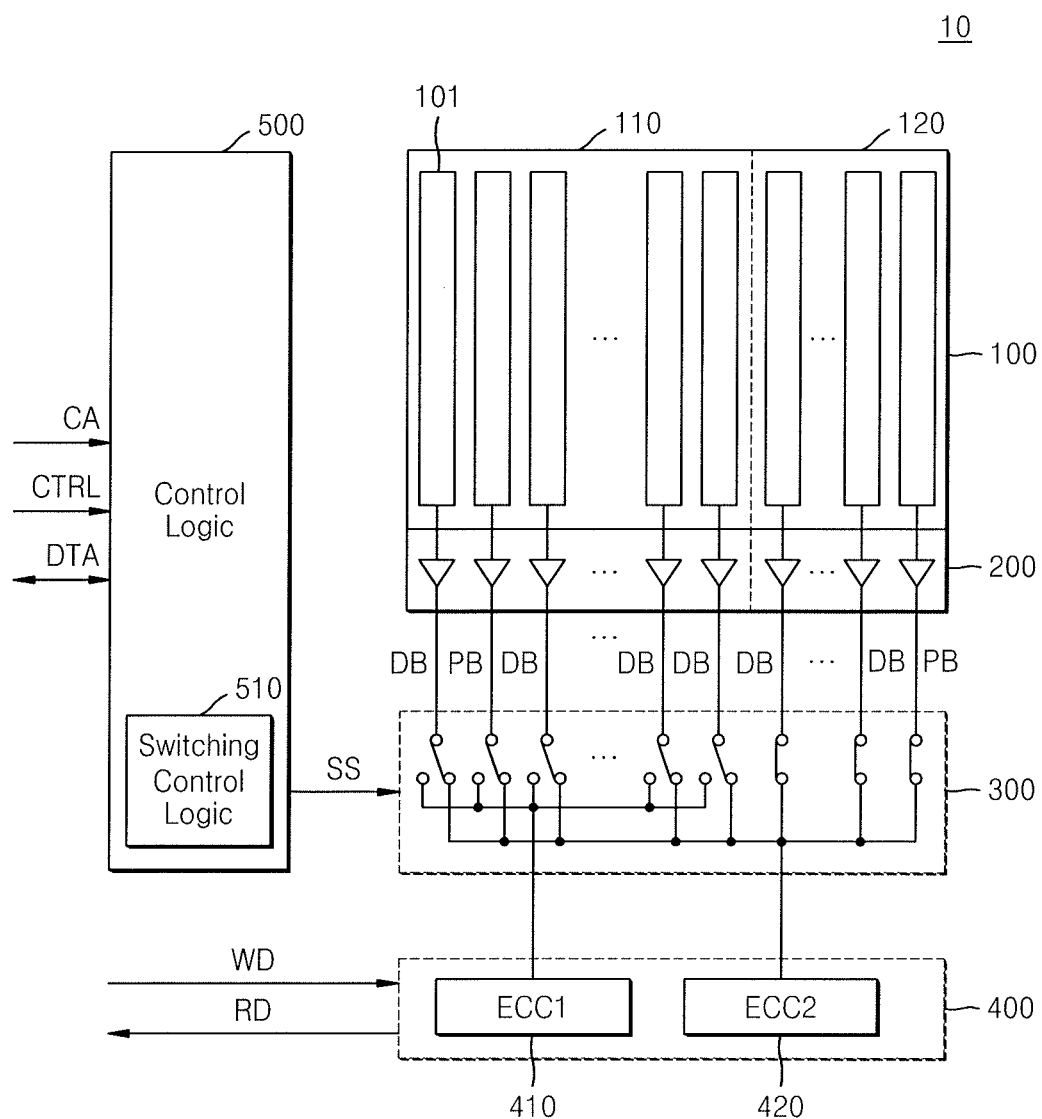
FIG. 6B illustrates a second error correction operation of a memory device according to an example embodiment.
Figure 6C:
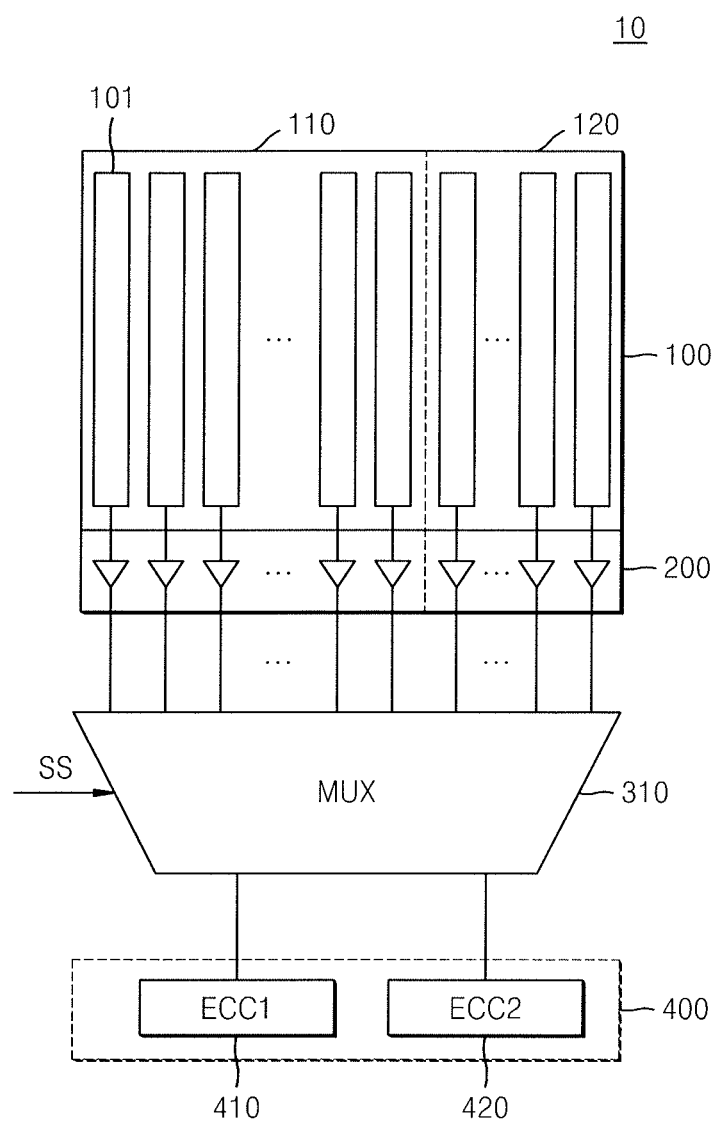
FIG. 6C illustrates a multiplexer as a switching circuit of a memory device according to an example embodiment.

FIG. 6A illustrates the memory device 10 that performs a first error correction operation, according to an example embodiment. FIG. 6B illustrates the memory device 10 that performs a second error correction operation, according to an example embodiment. FIG. 6C illustrates the memory device 10 including a multiplexer 310 corresponding to the switching circuit 300, according to an example embodiment.

The memory device 10 may perform the first error correction operation on first data in the first memory area 110 that is influenced by a high-temperature process, by using the first sub error correction circuit 410 in FIG. 6A, and perform the second error correction operation on second data in the second memory area 120 that is not influenced by the high-temperature process, by using the second sub error correction circuit 420 in FIG. 6B.

Referring to FIG. 6A, during the first error correction operation of the memory device 10, the control logic 500 may transmit a switching signal SS to the switching circuit 300. The switching signal SS may control to connect the sub memory areas 101 of the first memory area 110 to the first sub error correction circuit 410. For example, a write operation for writing data in the first memory area 110 or a read operation for reading data from the first memory area 110 is performed as described below.

During the write operation, the control logic 500 may control the row decoder 700 and the column decoder 800 to write data bits DBs or parity bits PBs in at least some memory cells in the first memory area 110. When write data WD is received from the memory controller 20, the first sub error correction circuit 410 may generate data bits DBs and parity bits PBs based on the write data WD and write the data bits DBs and the parity bits PBs in the sub memory areas 101 in the first memory area 110.

According to an example embodiment, the first memory area 110 may include 50 sub memory areas 101. The first sub error correction circuit 410 may write the write data WD in 32 sub memory areas 101 by transmitting the data bits DBs (e.g., 32 data bits) to the 32 sub memory areas 101. Further, the first sub error correction circuit 410 may write parity bits (e.g., 18 parity bits) for the write data WD, in 18 sub memory areas 101 by transmitting the parity bits PBs to the 18 sub memory areas 101. For example, some sub memory areas 101 of the first memory area 110 may store the data bits DBs of the write data WD, and other sub memory areas 101 of the first memory area 110 may store the parity bits PBs for the data bits DBs of the write data WD.

During the read operation, the memory device 10 may output read data RD that may be generated by detecting and correcting errors of data stored in the first memory area 110. According to an example embodiment, the control logic 500 may control the row decoder 700 and the column decoder 800 to read the data bits DBs or the parity bits PBs stored in at least some memory cells of the first memory area 110. The first sub error correction circuit 410 may receive the data bits DBs and the parity bits PBs through the switching circuit 300 from the first memory area 110 and perform the first error correction operation for detecting or correcting errors of the data bits DBs using the parity bits PBs.

Referring to FIG. 6B, during the second error correction operation of the memory device 10, the control logic 500 may transmit a switching signal SS to the switching circuit 300. The switching signal SS may control to connect sub memory areas 101 of the first and second memory areas 110 and 120 to the second sub error correction circuit 420. As both the second memory area 120 and the first memory area 110 are connected to the second sub error correction circuit 420, the number of input/output lines IOLN may be increased and thus a high-speed error correction operation may be performed.

For example, a write operation for writing data in the first and second memory areas 110 and 120 or a read operation for reading data from the first and second memory areas 110 and 120 is similar to that described above in relation to FIG. 6A.

Referring to FIGS. 6A and 6B, first and second error correction operations performed by the first and second sub error correction circuits 410 and 420 in the error correction circuit 400 may correct different numbers of bit errors or detect different numbers of bit errors. For example, the first sub error correction circuit 410 may correct a 3-bit error and/or detect a 4-bit error in the first error correction operation, and the second sub error correction circuit 420 may correct a 2-bit error and/or detect a 3-bit error in the second error correction operation. For example, the first sub error correction circuit 410 may correct and detect a larger number of bit errors that the second sub error correction circuit 420. For example, during a single read or write operation, a ratio of the number of parity bits PBs to the number of data bits DBs in the first error correction operation may be higher than a ratio of the number of parity bits PBs to the number of data bits DBs in the second error correction operation.

For example, the first sub error correction circuit 410 may transmit the data bits DBs to the 32 sub memory areas 101 in the first memory area 110 and transmit the parity bits PBs to the 18 sub memory areas 101. Thus, a ratio of the number of input/output lines IOLN for transmitting the parity bits PBs to the number of input/output lines IOLN for transmitting the data bits DBs may be 18/32. Further, the second sub error correction circuit 420 may transmit the data bits DBs to the 64 sub memory areas 101 in the first and second memory areas 110 and 120 and transmit the parity bits PBs to the 14 sub memory areas 101. Thus, a ratio of the number of input/output lines IOLN for transmitting the parity bits PBs to the number of input/output lines IOLN for transmitting the data bits DBs may be 14/64.

Referring to FIG. 6C, the switching circuit 300 may be implemented as the multiplexer 310. The multiplexer 310 may operate similarly to the switching circuit 300 described above in relation to FIGS. 6A and 6B, based on a switching signal SS received from the control logic 500. For example, the multiplexer 310 may be controlled by the switching signal SS to transmit data included in at least one of the first and second memory areas 110 and 120, to one of the first and second sub error correction circuits 410 and 420.

For example, an error correction operation may be performed using two memory areas including the first and second memory areas 110 and 120 and two sub error correction circuits including the first and second sub error correction circuits 410 and 420 in FIGS. 6A, 6B, and 6C. The number of memory areas and the number of sub error correction circuits may be changed and may not limited thereto.

Figure 7A:
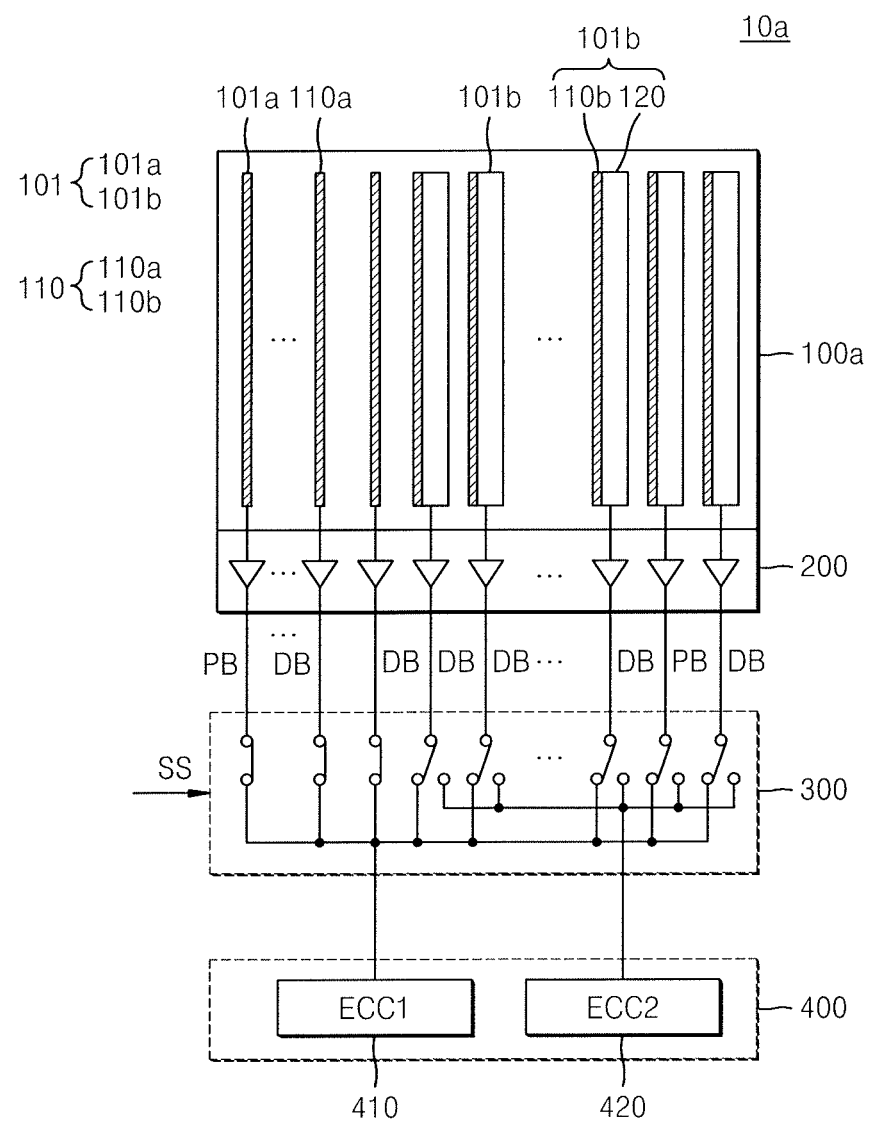
FIG. 7A illustrates a first error correction operation of a memory device according to an example embodiment.
Figure 7B:
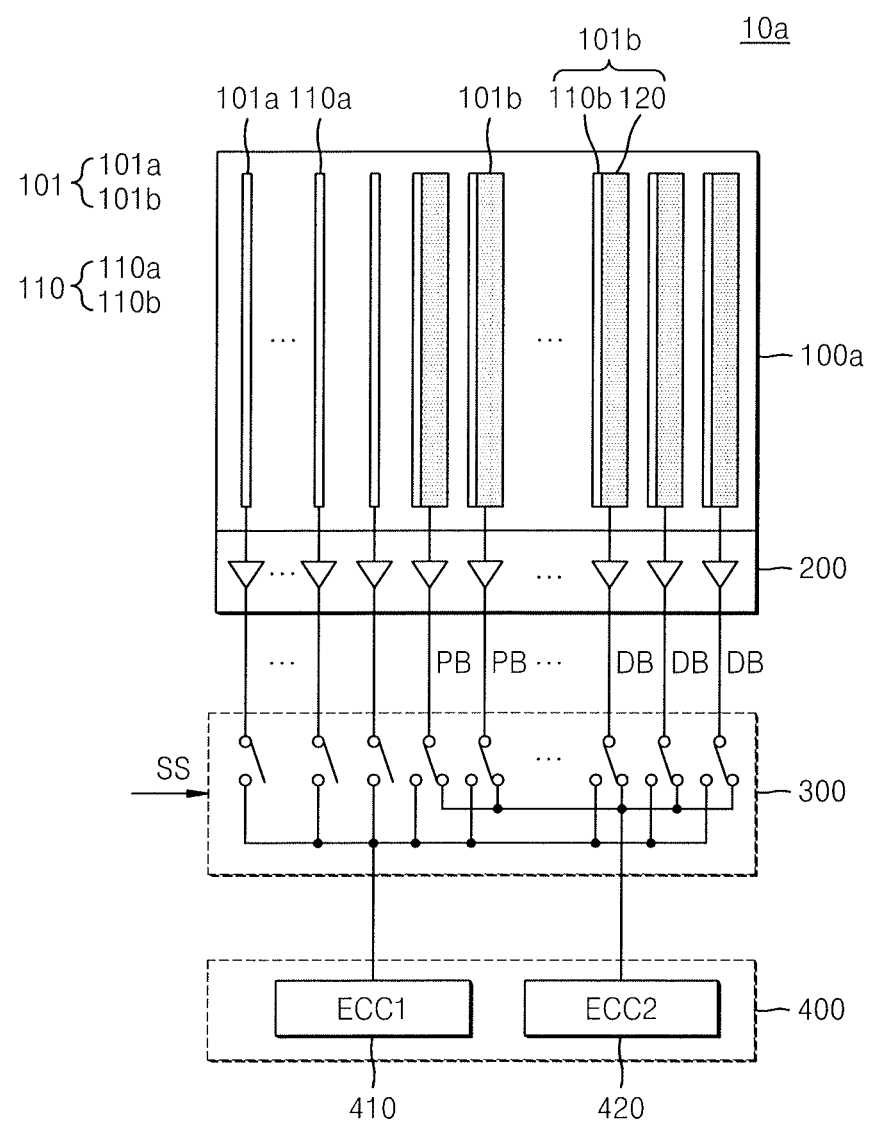
FIG. 7B illustrates a second error correction operation of a memory device according to an example embodiment.
Figure 7C:
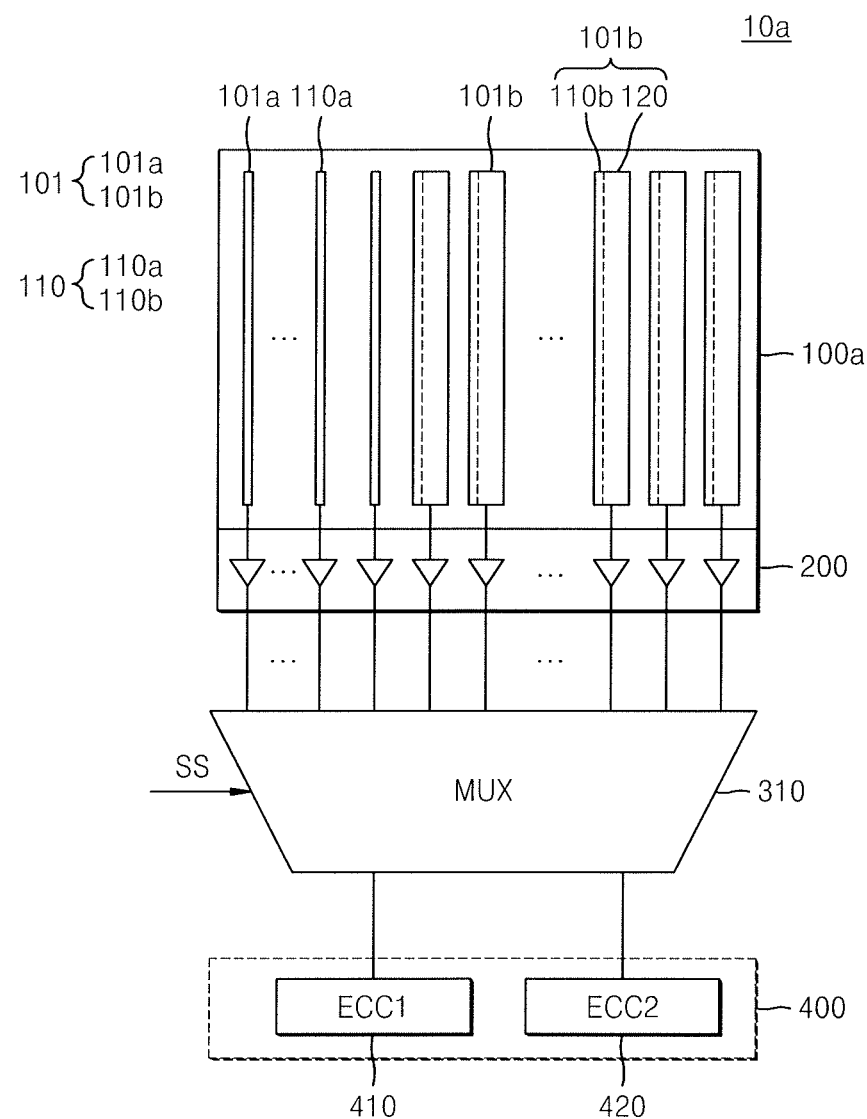
FIG. 7C illustrates a multiplexer as a switching circuit of a memory device according to an example embodiment.
Figure 7D:
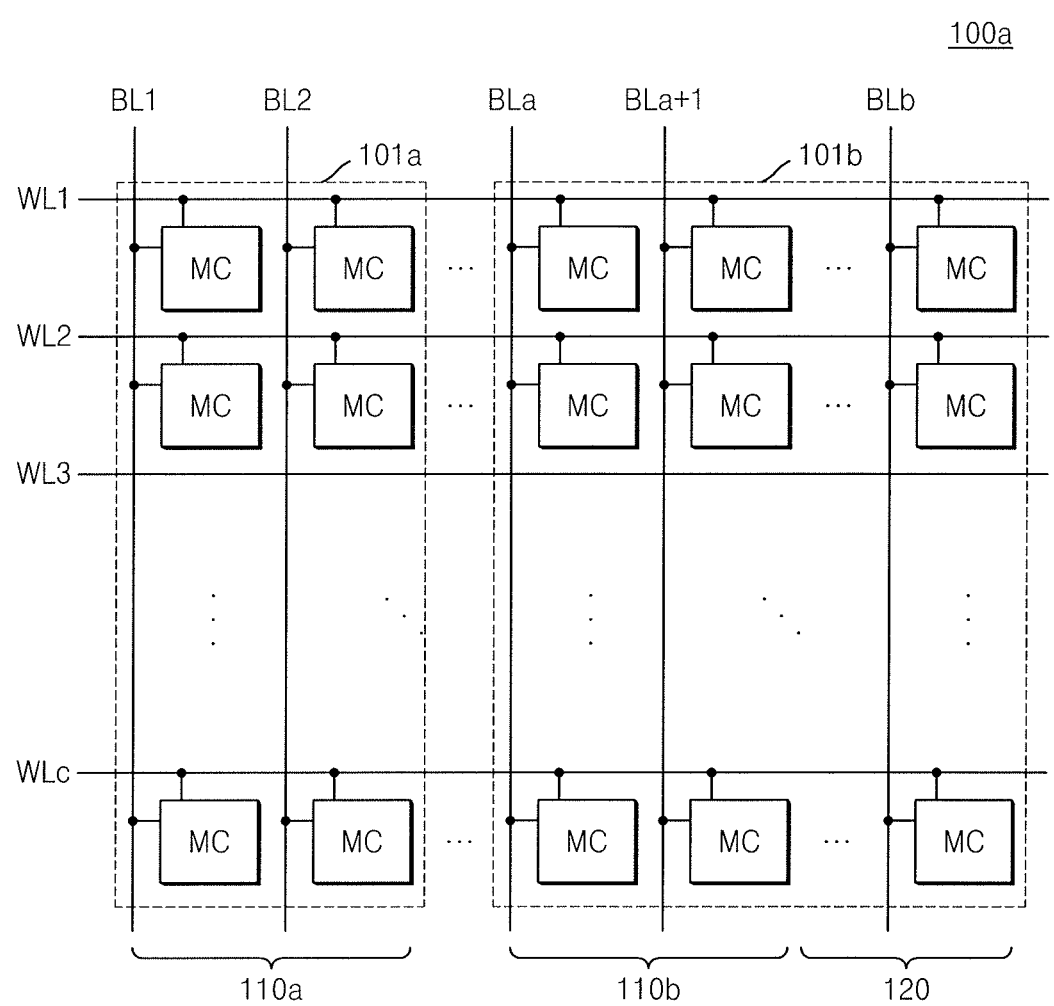
FIG. 7D illustrates first sub memory areas and second sub memory areas of a memory device according to an example embodiment.

FIG. 7A illustrates the memory device 10a that performs a first error correction operation, according to an example embodiment. FIG. 7B illustrates the memory device 10a that performs a second error correction operation, according to an example embodiment. FIG. 7C illustrates the memory device 10a including the multiplexer 310 corresponding to the switching circuit 300, according to an example embodiment. FIG. 7D illustrates first sub memory areas 101a and second sub memory areas 101b according to an example embodiment.

Referring to FIGS. 7A, 7B, and 7C, a memory cell array 100a may include a first memory area 110 and a second memory area 120. For example, the first memory area 110 may include first areas in the memory cell array 100a, which are marked with slash lines. The first memory area 110 may include memory cells MC that are influenced by a high-temperature process. The second memory area 120 may include second areas in the memory cell array 100a, which are not marked with slash lines. The second memory area 120 may include memory cells MC that are not influenced by a high-temperature process. Further, the memory cell array 100a may include sub memory areas 101. For example, each sub memory area 101 may be connected to each sense amplifier in the input/output circuit 200. The sub memory areas 101 may include a first sub memory area 101a and a second sub memory area 101b.

For example, the first and second sub memory areas 101a and 101b may transmit data bits DBs or parity bits PBs to the error correction circuit 400 through global bit lines GBL or may receive data bits DBs or parity bits PBs from the error correction circuit 400 through the global bit lines GBL.

Referring to FIG. 7D, the first and second sub memory areas 101a and 101b may include memory cells MC connected to different bit lines BL. For example, the first sub memory area 101a may be connected to bit lines BL1 and BL2, and the second sub memory area 101b may be connected to bit lines BLa to BLb. For example, all memory cells MC (110a) in the first sub memory areas 101a may be influenced by the high-temperature process, and are part of the first memory area 110. Further, only first memory cells MC (110b) in the second sub memory areas 101b may be influenced by the high-temperature process to be part of the first memory area 110. Second memory cells MC (120) in the second sub memory areas 101b may not be influenced by the high-temperature process and are part of the second memory area 120. For example, the first memory cells MC (110b) in the second sub memory areas 101b, which are influenced by the high-temperature process, may be memory cells in a left area of each second sub memory area 101b, and the second memory cells MC (120) in the second sub memory areas 101*b*, which are not influenced by the high-temperature process, may be memory cells MC in a right area of each second sub memory area 101*b*. Alternatively, the first memory cells MC (110*b*) in the second sub memory areas 101*b*, which are influenced by the high-temperature process, may be memory cells in the right area of each second sub memory area 101*b*, and the second memory cells MC in the second sub memory areas 101*b*, which are not influenced by the high-temperature process, may be memory cells MC in the left area of each second sub memory area 101*b*.

The memory device 10*a* may perform the first error correction operation on data written in the first memory area 110 or data read from the first memory area 110, which is influenced by the high-temperature process, by using the first sub error correction circuit 410 in FIG. 7A, and perform the second error correction operation on data written in the second memory area 120 or data read from the second memory area 120, which is not influenced by the high-temperature process, by using the second sub error correction circuit 420 in FIG. 7B.

Referring to FIG. 7A, during the first error correction operation of the memory device 10*a*, the control logic 500 may transmit a switching signal SS to the switching circuit 300. The switching signal SS may control to connect input/output lines IOLN corresponding to the first memory area 110 to the first sub error correction circuit 410. For example, the input/output lines IOLN corresponding to the first memory area 110 may be connected to memory cells MC in the first sub memory area 101*a* and the first memory cells MC in the second sub memory area 101*b*, which are influenced by the high-temperature process, through the input/output circuit 200. Further, a write operation for writing data bits DBs or parity bits PBs in the first memory areas 110*a* and 110*b* or a read operation for reading data bits DBs or parity bits PBs from the first memory area 110 is similar to that described above in relation to FIGS. 6A and 6B.

Referring to FIG. 7B, during the second error correction operation of the memory device 10*a*, the control logic 500 may transmit a switching signal SS to the switching circuit 300. The switching signal SS may control to connect input/output lines IOLN corresponding to the second memory area 120, to the second sub error correction circuit 420. The input/output lines IOLN corresponding to the second memory area 120 may be connected to the second memory cells MC in the second sub memory area 101*b*, which are not influenced by the high-temperature process, through the input/output circuit 200. Further, a write operation for writing data in the second memory area 120 or a read operation for reading data from the second memory area 120 is similar to that described above in relation to FIGS. 6A and 6B.

Referring to FIG. 7C, the switching circuit 300 may be implemented as the multiplexer 310. The multiplexer 310 may operate similarly to the switching circuit 300 described above in FIGS. 7A and 7B, based on a switching signal SS received from the control logic 500.

Figure 8:
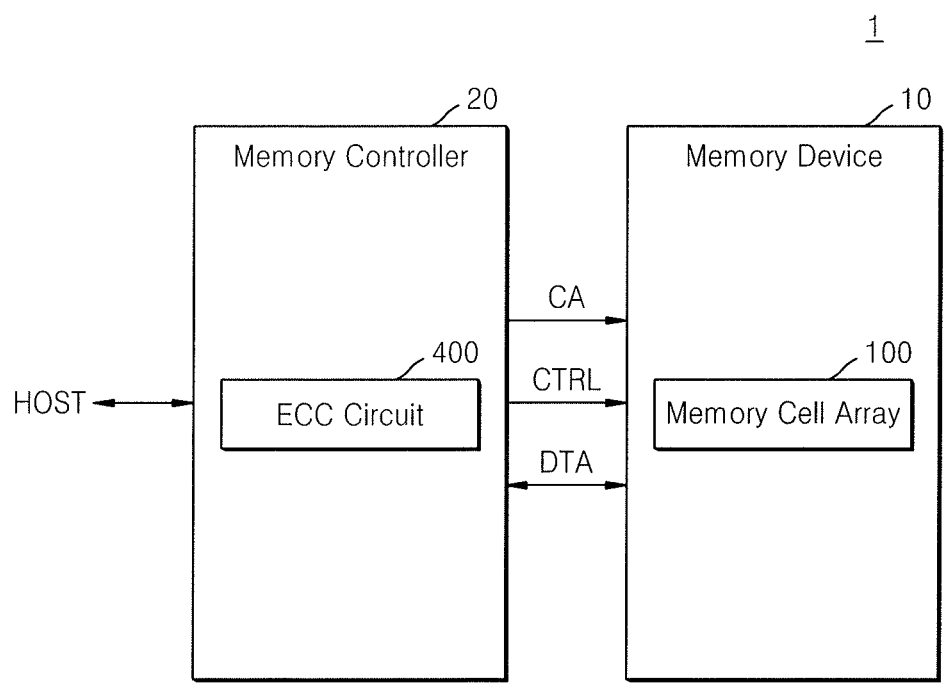
FIG. 8 illustrates a memory system according to an example embodiment.

FIG. 8 illustrates the memory system 1 according to an example embodiment. Referring to FIG. 8, the memory controller 20 may include the error correction circuit 400. Unlike FIG. 2, bit errors of data in the memory cell array 100 may be detected or corrected using the error correction circuit 400 in the memory controller 20.

Figure 9:
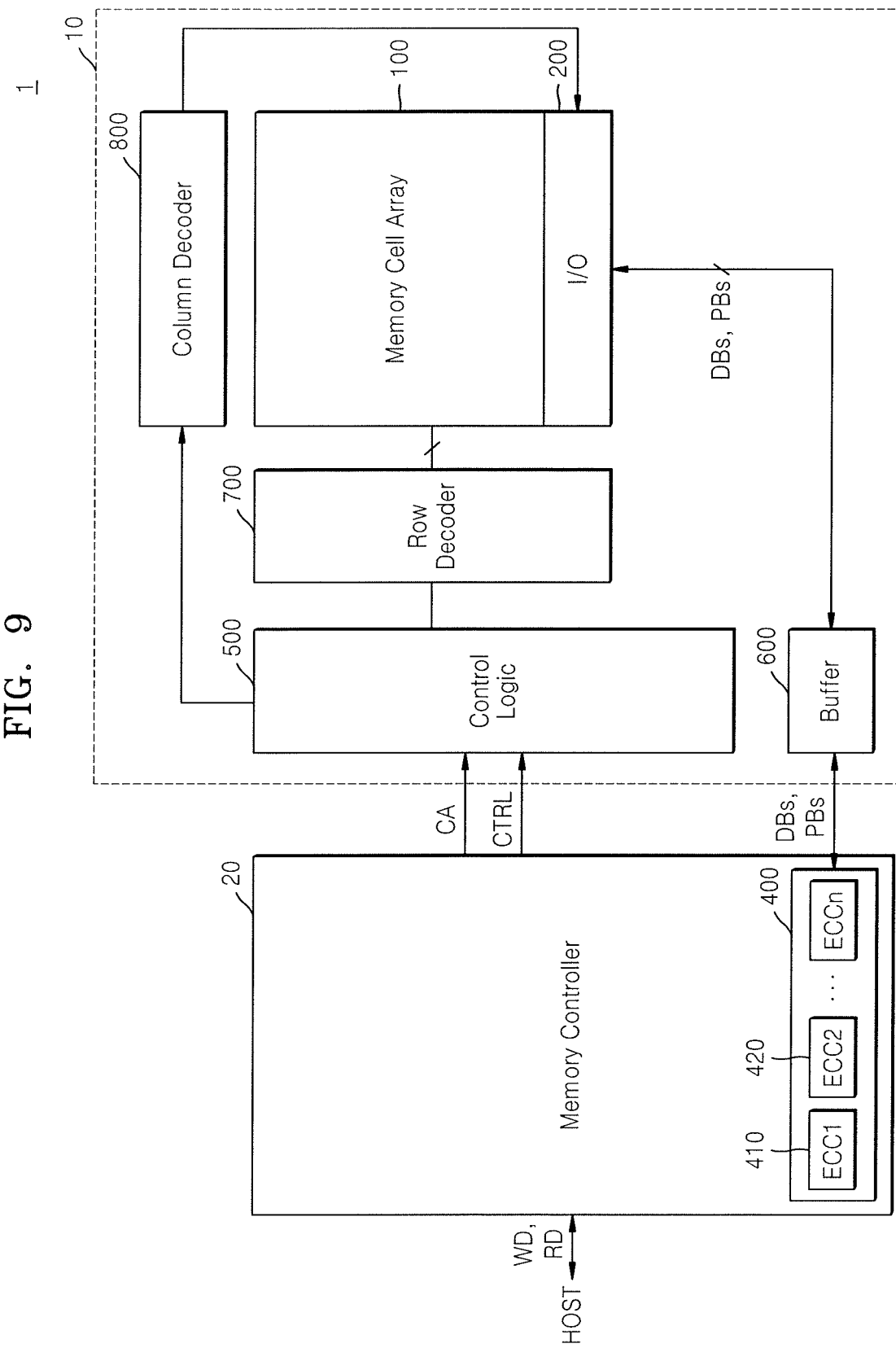
FIG. 9 illustrates the memory system of FIG. 8.

FIG. 9 illustrates the memory system 1 of FIG. 8. Referring to FIG. 9, the memory controller 20 may include the error correction circuit 400.

According to an example embodiment, one of the sub error correction circuits ECC1 to ECCn (e.g., the first sub error correction circuit 410) may generate parity bits PBs for write data WD received from the host HOST. The memory controller 20 may provide a command/address signal CA to the memory device 10 to write the write data WD and the parity bits PBs for the write data WD in memory cells. For example, when one of the sub error correction circuits ECC1 to ECCn (e.g., the first sub error correction circuit 410) generates the parity bits PBs for the write data WD, the memory controller 20 may provide the command/address signal CA to the memory device 10 to write the write data WD and the parity bits PBs in some memory cells (e.g., a first memory area).

For example, when the first sub error correction circuit 410 generates the parity bits PBs, the memory controller 20 may write the data bits DBs and the parity bits PBs in the first memory area influenced by a high-temperature process. In other words, the memory controller 20 may determine a memory area corresponding to a certain sub error correction circuit which generates the parity bits PBs and write the data bits DBs and the parity bits PBs in the determined memory area.

In addition, one of the sub error correction circuits ECC1 to ECCn (e.g., the first sub error correction circuit 410) may receive data bits DBs and parity bits PBs from some of a plurality of memory cells in the memory cell array 100 (e.g., the first memory area) and perform an error correction operation with reference to the data bits DBs and the parity bits PBs. After performing the error correction operation, the error correction circuit 400 may transmit the read data RD to the memory controller 20.

For example, when the memory controller 20 receives the data bits DBs and the parity bits PBs from the first memory area, which is influenced by a high-temperature process, the first sub error correction circuit 410 may perform an error correction operation. In other words, the memory controller 20 may determine a sub error correction circuit corresponding to a certain memory area and perform an error correction operation.

Figure 10:
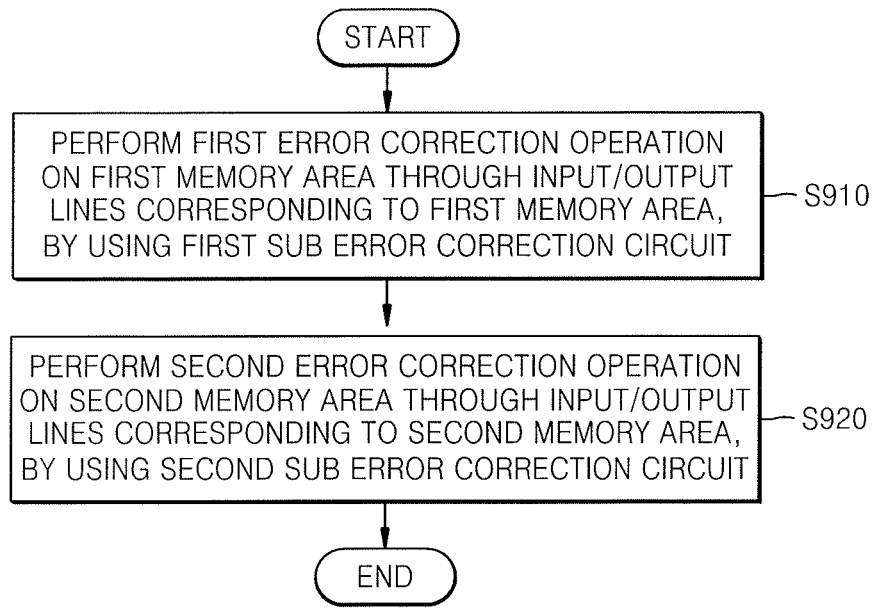
FIG. 10 illustrates a flowchart of a method of operating a memory system according to an example embodiment.

FIG. 10 is a flowchart of a method of operating the memory system 1, according to an example embodiment.

In operation S910, a first error correction operation may be performed on the first memory area 110 through input/output lines IOLN corresponding to the first memory area 110, by using the first sub error correction circuit 410. For example, the first memory area 110 may be a memory area having a temperature exceeding over an operating temperature of memory cells when a high-temperature process is performed on the memory device 10. For example, the high-temperature process may be a reflow soldering process for attaching the memory device 10 to a PCB or the like at a high-temperature. Further, the high-temperature process may include any process performed at a temperature greater than an operating temperature of memory cells.

In operation S920, a second error correction operation may be performed on the second memory area 120 through input/output lines IOLN corresponding to the second memory area 120, by using the second sub error correction circuit 420.

According to an example embodiment, one of the first and second error correction operations may be selected by a switching signal SS generated based on a command/address signal CA received by the memory device 10.

According to an example embodiment, the first memory area 110 may be electrically connected to the first sub error correction circuit 410 through, e.g., global bit lines GBL, sense amplifiers SA, and input/output lines IOLN. The second memory area 120 may be electrically connected to the second sub error correction circuit 420 through, e.g., global bit lines GBL, sense amplifiers SA, and input/output lines IOLN.

Based on a memory device and an operating method thereof, according to an example embodiment, as a first error correction code requiring a large number of parity bits is used for a partial area of a memory cell array, which has a high bit error rate, and a second error correction code requiring a small number of parity bits is used for another partial area of the memory cell array, which has a low bit error rate, the number of parity bits may be optimized and overhead of the memory cell areas may be reduced. An efficiency of the memory device may be improved.

In some embodiments, blocks or steps of a method or algorithm and functions described in connection with the embodiments disclosed herein may be embodied directly in hardware, in a software module executed by a processor, or in a combination of software and hardware. If implemented in software, the functions may be stored on or transmitted over as one or more instructions or code on a tangible, non-transitory computer-readable medium. A software module may reside in, for example, Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other suitable form of storage medium.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory system, comprising:
a memory cell array including a plurality of memory areas, the plurality of memory areas including a first memory area and a second memory area;
an input/output circuit configured to amplify an output from the memory cell array and including a plurality of input/output lines for transmitting or receiving data bits and parity bits to or from the plurality of memory areas;
an error correction circuit including a plurality of sub error correction circuits, the plurality of sub error correction circuits including a first sub error correction circuit for performing a first error correction operation on first data bits of the first memory area received through the plurality of input/output lines, and a second sub error correction circuit for performing a second error correction operation on second data bits of the second memory area received through the plurality of input/output lines; and
a switching circuit connected in between the memory cell array and the first sub error correction circuit, and in between the memory cell array and the second sub error correction circuit, wherein:

the plurality of input/output lines includes first input/output lines connected to only the first memory area, and second input/output lines connected only to the second memory area,
the switching circuit is configured to electrically connect the first sub error correction circuit to only the first input/output lines from among the first and second input/output lines and, simultaneously, electrically disconnect the second sub error correction circuit from both the first input/output lines and the second input/output lines, and
the switching circuit is configured to electrically disconnect the first sub error correction circuit from the first input/output lines and, simultaneously, electrically connect the second sub error correction circuit to both the first input/output lines and the second input/output lines.

2. The memory system as claimed in claim 1, further comprising a control logic configured to control the switching circuit.

3. The memory system as claimed in claim 2, wherein:
the first and second memory areas each include sub memory areas,
the first input/output lines correspond to sub memory areas included in the first memory area, and
the second input/output lines corresponding to sub memory areas included in the second memory area.

4. The memory system as claimed in claim 3, wherein, during the first error correction operation, the first sub error correction circuit writes data bits in some sub memory areas included in the first memory area and writes parity bits in other sub memory areas included in the first memory area.

5. The memory system as claimed in claim 4, wherein a ratio of a number of sub memory areas, in which the parity bits are written, to a number of sub memory areas, in which the data bits are written by the first sub error correction circuit during the first error correction operation, is higher than a ratio of a number of sub memory areas, in which the parity bits are written, to a number of sub memory areas, in which the data bits are written by the second sub error correction circuit during the second error correction operation.

6. The memory system as claimed in claim 1, wherein:
the first sub error correction circuit performs the first error correction operation on some memory cells included in the first memory area, and
the second sub error correction circuit performs the second error correction operation on other memory cells included in the first memory area and all memory cells included in the second memory area.

7. The memory system as claimed in claim 1, wherein the first and second error correction operations include correcting different numbers of bit errors or detecting different numbers of bit errors.

8. The memory system as claimed in claim 1, wherein:
the input/output circuit further includes a plurality of sense amplifiers, and
sub memory areas included in the plurality of memory areas are connected to the input/output lines extending from the plurality of sense amplifiers.

9. The memory system as claimed in claim 1, wherein the first memory area has a higher bit error rate than the second memory area.

10. A memory device, comprising:
a memory cell array including a plurality of memory areas, the plurality of memory areas including a first memory area and a second memory area;

an input/output circuit configured to amplify an output from the memory cell array and including a plurality of input/output lines for transmitting or receiving data bits and parity bits to or from the plurality of memory areas;

an error correction circuit including a plurality of sub error correction circuits, the plurality of sub error correction circuits including a first sub error correction circuit for performing a first error correction operation on first data bits of the first memory area received through the plurality of input/output lines, and a second sub error correction circuit for performing a second error correction operation on second data bits of the second memory area received through the plurality of input/output lines;

a switching circuit connected in between the memory cell array and the first sub error correction circuit, and in between the memory cell array and the second sub error correction circuit;

wherein the plurality of input/output lines includes first input/output lines connected to only the first memory area, and second input/output lines connected only to the second memory area; and a control logic to control the switching circuit to electrically connect the first sub error correction circuit to only the first input/output lines from among the first and second input/output lines and, simultaneously, electrically disconnect the second sub error correction circuit from both the first input/output lines and control the switching circuit to electrically disconnect the first sub error correction circuit from the first input/output lines and, simultaneously, electrically connect the second sub error correction circuit to both the first input/output lines and the second input/output lines.

11. The memory device as claimed in claim 10, wherein the first memory area has a higher bit error rate than the second memory area.

* * * * *